(12) United States Patent
Lin et al.

(10) Patent No.: US 10,163,813 B2
(45) Date of Patent: Dec. 25, 2018

(54) CHIP PACKAGE STRUCTURE INCLUDING REDISTRIBUTION STRUCTURE AND CONDUCTIVE SHIELDING FILM

(71) Applicant: Taiwan Semiconductor Manufacturing Co., Ltd., Hsinchu (TW)

(72) Inventors: Jing-Cheng Lin, Hsinchu (TW); Po-Hao Tsai, Taoyuan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/354,195

(22) Filed: Nov. 17, 2016

(65) Prior Publication Data

US 2018/0138130 A1    May 17, 2018

(51) Int. Cl.
| | |
|---|---|
| *H01L 23/552* | (2006.01) |
| *H01L 23/498* | (2006.01) |
| *H01L 21/48* | (2006.01) |
| *H01L 23/00* | (2006.01) |
| *H01L 25/065* | (2006.01) |

(Continued)

(52) U.S. Cl.
CPC .......... *H01L 23/552* (2013.01); *H01L 21/485* (2013.01); *H01L 21/4853* (2013.01); *H01L 21/4857* (2013.01); *H01L 21/561* (2013.01); *H01L 23/49805* (2013.01); *H01L 23/49811* (2013.01); *H01L 23/49822* (2013.01); *H01L 23/49838* (2013.01); *H01L 24/16* (2013.01); *H01L 24/24* (2013.01); *H01L 25/0657* (2013.01); *H01L 21/568* (2013.01); *H01L 23/3128* (2013.01); *H01L 23/49816* (2013.01); *H01L 2224/16235* (2013.01);

(Continued)

(58) Field of Classification Search
CPC ... H01L 2224/0233; H01L 2224/02331; H01L 2224/0235; H01L 2224/02375; H01L 2224/02381; H01L 2924/3025; H01L 23/552; H01L 23/556; H01L 23/60; H01L 2225/06537; H01L 2224/2405; H01L 23/49805; H01L 23/49816; H01L 23/19838
See application file for complete search history.

(56) References Cited

U.S. PATENT DOCUMENTS

| | | | |
|---|---|---|---|
| 8,031,485 B2 * | 10/2011 | Bogursky | H01L 23/552 361/800 |
| 8,361,842 B2 | 1/2013 | Yu et al. | |

(Continued)

*Primary Examiner* — Daniel Luke
(74) *Attorney, Agent, or Firm* — McClure, Qualey & Rodack, LLP

(57) ABSTRACT

A chip package structure is provided. The chip package structure includes a redistribution structure including a dielectric structure and a grounding line in the dielectric structure. The grounding line includes a main portion and an end enlarged portion connected to the main portion and laterally accessible from the dielectric structure. The chip package structure includes a chip structure over the redistribution structure. The chip package structure includes a conductive shielding film disposed over the chip structure and a first sidewall of the end enlarged portion. The conductive shielding film is electrically connected to the grounding line. A thickness of the end enlarged portion increases from the main portion to the conductive shielding film.

20 Claims, 18 Drawing Sheets

(51) Int. Cl.
*H01L 21/56* (2006.01)
*H01L 23/31* (2006.01)

(52) U.S. Cl.
CPC ............. *H01L 2224/2405* (2013.01); *H01L 2225/06537* (2013.01); *H01L 2924/3025* (2013.01)

(56) References Cited

U.S. PATENT DOCUMENTS

| | | | |
|---|---|---|---|
| 8,373,281 B2 * | 2/2013 | Kobayashi | H01L 21/4832 257/737 |
| 8,378,466 B2 * | 2/2013 | Chiu | H01L 21/568 257/508 |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,766,429 B2 * | 7/2014 | Kim | H01L 25/105 257/659 |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |
| 8,877,554 B2 | 11/2014 | Tsai et al. | |
| 9,922,937 B2 * | 3/2018 | Kuhlman | H01L 23/552 |
| 2011/0291288 A1 | 12/2011 | Wu et al. | |
| 2011/0298101 A1 * | 12/2011 | Pagaila | H01L 21/561 257/659 |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0264684 A1 | 10/2013 | Yu et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |
| 2015/0348936 A1 * | 12/2015 | Lin | H01L 23/552 257/659 |
| 2017/0330839 A1 * | 11/2017 | Kim | H01L 24/13 |

* cited by examiner

CHIP PACKAGE STRUCTURE INCLUDING REDISTRIBUTION STRUCTURE AND CONDUCTIVE SHIELDING FILM

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform, and the performance of semiconductor devices is easily affected. For example, electromagnetic interference (EMI) is a challenge for most semiconductor devices. EMI disturbances can interrupt, degrade, or limit the performance of semiconductor devices.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1O are cross-sectional views of various stages of a process for forming a chip package structure, in accordance with some embodiments.

FIG. 1M-2 is an enlarged top view of the grounding line of FIG. 1M, in accordance with some embodiments.

FIG. 1N-1 is a top view of a tray in FIG. 1N, in accordance with some embodiments.

FIG. 1O-1 is an enlarged cross-sectional view of a region of FIG. 1O, in accordance with some embodiments.

FIG. 2 is an enlarged cross-sectional view partially showing a chip package structure, in accordance with some other embodiments.

DETAILED DESCRIPTION

Figure 1A:
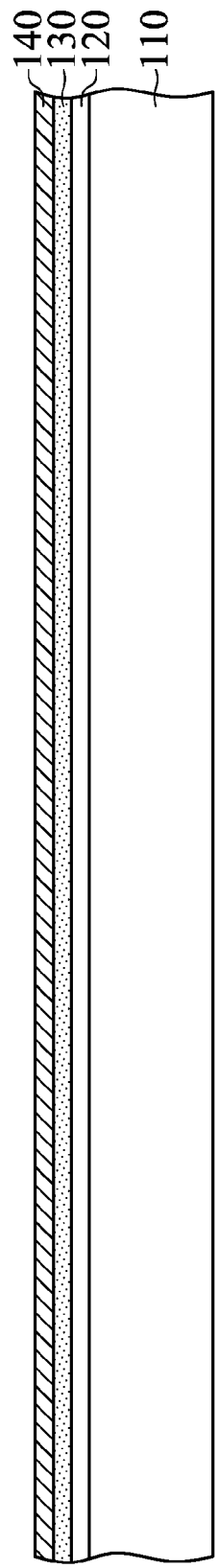

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1O are cross-sectional views of various stages of a process for forming a chip package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments. The carrier substrate 110 includes glass, silicon oxide, aluminum oxide, metal, a combination thereof, and/or the like, in accordance with some embodiments. The carrier substrate 110 includes a metal frame, in accordance with some embodiments.

As shown in FIG. 1A, an adhesive layer 120 is formed over the carrier substrate 110, in accordance with some embodiments. The adhesive layer 120 includes any suitable adhesive material, such as an ultraviolet (UV) glue or a Light-to-Heat Conversion (LTHC) glue, which loses its adhesive properties when exposed to UV lights or laser, in accordance with some embodiments. The adhesive layer 120 is formed using a lamination process, a spin coating process, a printing process, or another suitable process.

As shown in FIG. 1A, a buffer layer 130 is formed over the adhesive layer 120, in accordance with some embodiments. The buffer layer 130 is configured to provide structural support for bonding and help reduce die shift during subsequent process, in accordance with some embodiments. The buffer layer 130 includes a polymer material, such as polybenzoxazole (PBO), polyimide, or epoxy, in accordance with some embodiments. The buffer layer 130 is formed using a spin coating process, a chemical vapor deposition process, a laminating process, or a printing process, in accordance with some embodiments.

As shown in FIG. 1A, a conductive layer 140 is formed over the buffer layer 130, in accordance with some embodiments. The conductive layer 140 includes copper, titanium, combinations thereof, or another suitable conductive material. The conductive layer 140 is formed using a physical vapor deposition process or a chemical vapor deposition process, in accordance with some embodiments.

Figure 1B:
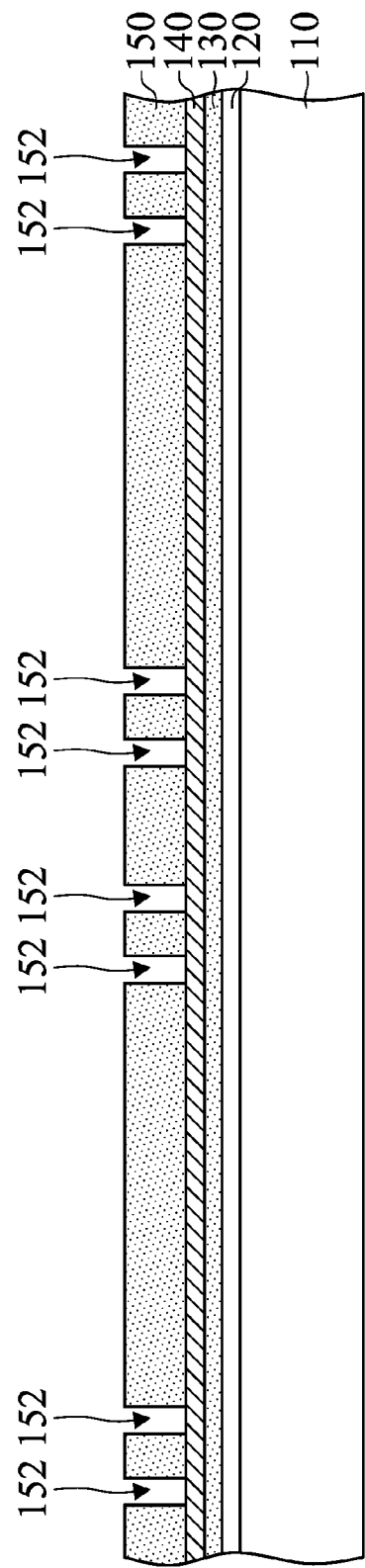

As shown in FIG. 1B, a mask layer 150 is formed over the conductive layer 140, in accordance with some embodiments. The mask layer 150 has through holes 152 exposing portions of the conductive layer 140, in accordance with some embodiments. The mask layer 150 includes a photoresist material or another suitable material.

Figure 1C:
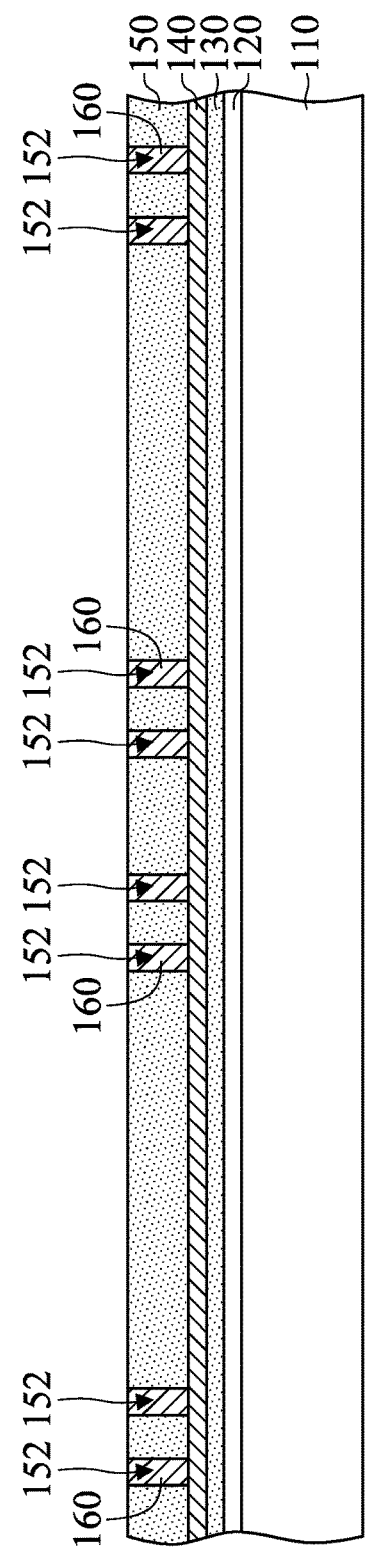

As shown in FIG. 1C, conductive via structures 160 are formed in the through holes 152, in accordance with some embodiments. The conductive via structures 160 are also referred to as conductive structures, in accordance with some embodiments. The conductive via structures 160 include copper or another suitable conductive material.

The formation of the conductive via structures 160 includes performing an electroplating process, in accordance with some embodiments. In some other embodiments, the conductive layer 140 is not formed, and the formation of the conductive via structures 160 includes performing a deposition process and a planarization process.

Figure 1D:
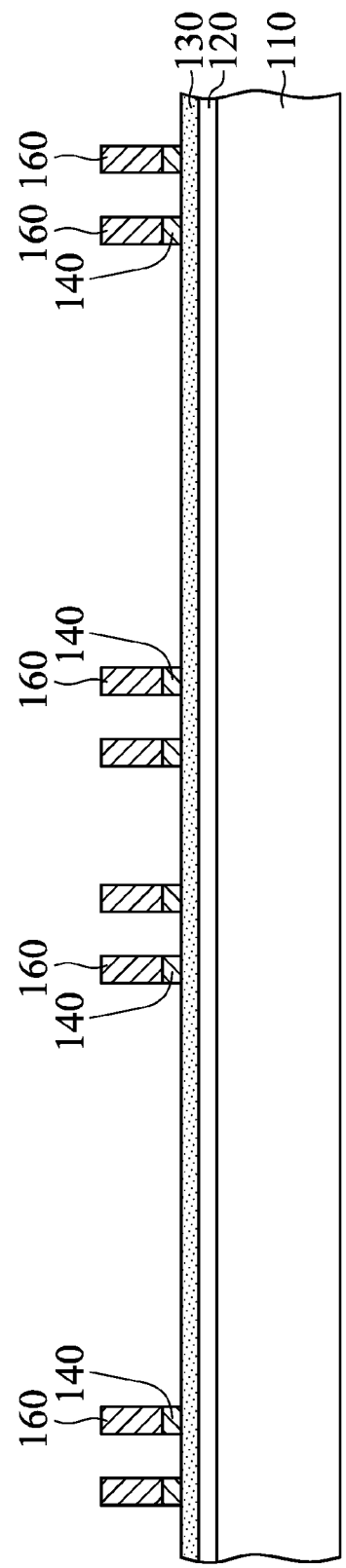

As shown in FIG. 1D, the mask layer 150 is removed, in accordance with some embodiments. The mask layer 150 is removed by dipping the mask layer 150 in a chemical solution, in accordance with some embodiments. The chemical solution includes, for example, ethyl lactate, anisole, methyl butyl acetate, amyl acetate, cresol novolak resin, and/or diazo photoactive compound.

As shown in FIG. 1D, the conductive layer 140, which is not covered by the conductive via structures 160, is removed, in accordance with some embodiments. The removal process includes a wet etching process or a dry etching process, in accordance with some embodiments.

Figure 1E:
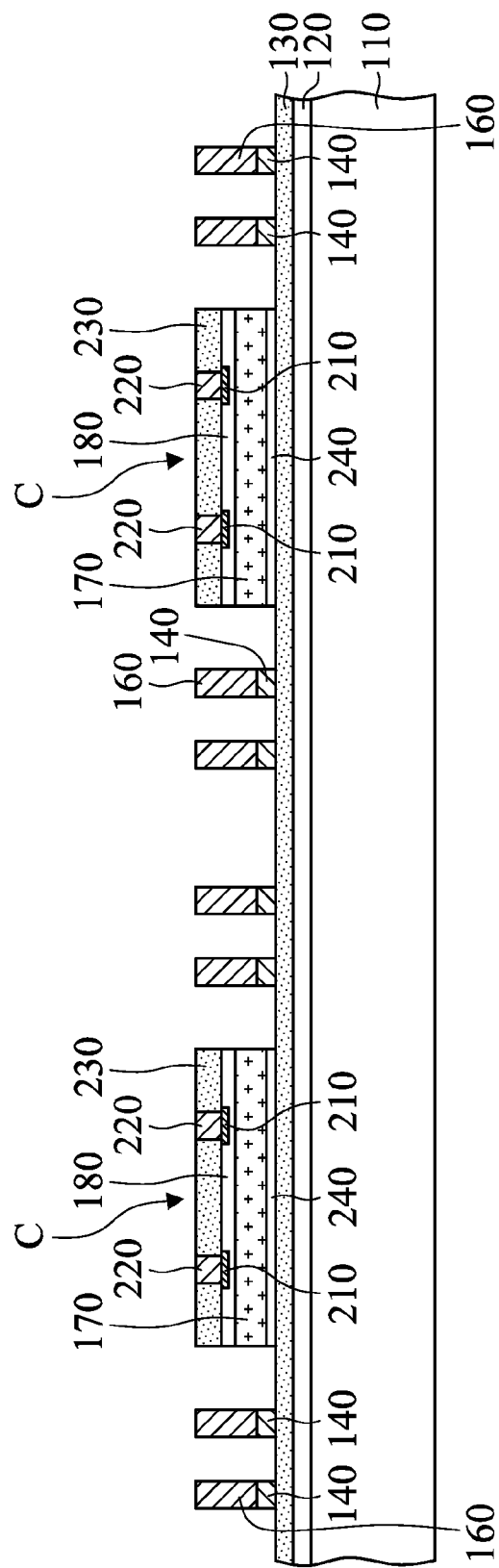

As shown in FIG. 1E, chip structures C are disposed over the buffer layer 130, in accordance with some embodiments. Each of the chip structures C includes a chip 170, a dielectric layer 180, bonding pads 210, interconnection structures 220, and a dielectric layer 230, in accordance with some embodiments. As shown in FIG. 1E, the chip 170 is disposed over the buffer layer 130, in accordance with some embodiments. The chip 170 is also referred to as a semiconductor substrate, a system-on-chip (SoC), a logic die, or a memory die, in accordance with some embodiments. In some other embodiments (not shown), each of the chip structures C includes chips 170.

As shown in FIG. 1E, in each of the chip structures C, the dielectric layer 180 is formed over the chip 170, in accordance with some embodiments. The bonding pads 210 are formed in the dielectric layer 180, in accordance with some embodiments. The bonding pads 210 are electrically connected to devices (not shown) formed in/over the chip 170, in accordance with some embodiments.

As shown in FIG. 1E, interconnection structures 220 are formed over the bonding pads 210 respectively, in accordance with some embodiments. The interconnection structures 220 include conductive pillars or conductive bumps, in accordance with some embodiments.

As shown in FIG. 1E, a dielectric layer 230 is formed over the dielectric layer 180 and surrounds the interconnection structures 220, in accordance with some embodiments. As shown in FIG. 1E, an adhesive layer 240 is positioned between the buffer layer 130 and the chip 170 to bond the chip 170 to the buffer layer 130, in accordance with some embodiments.

Figure 1F:
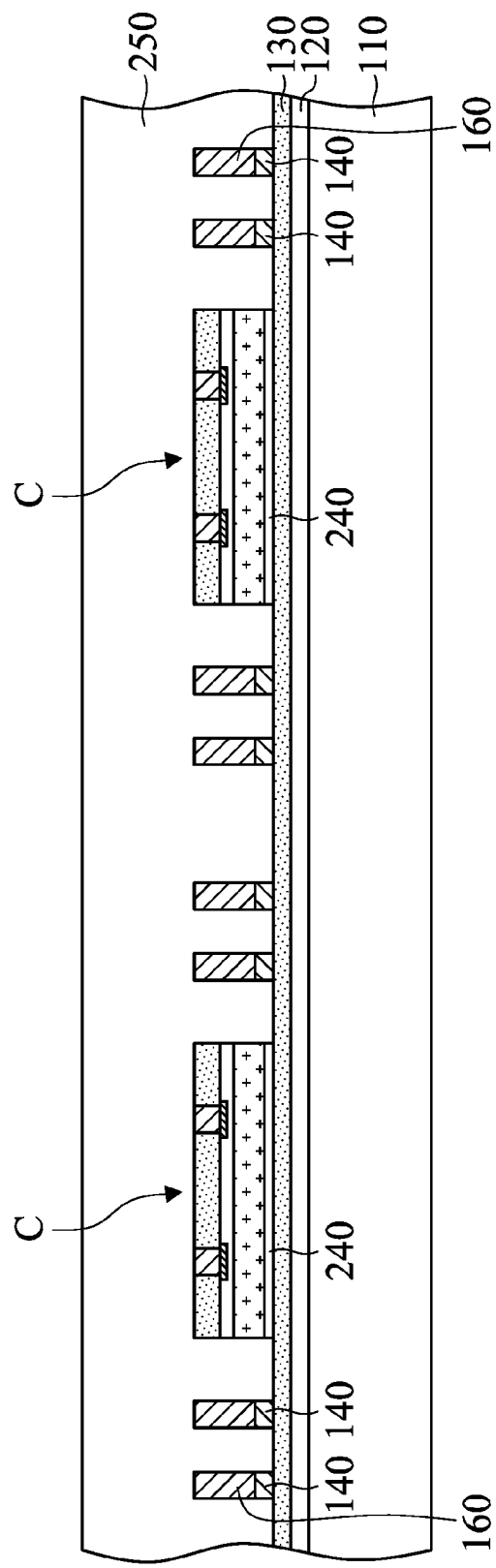

As shown in FIG. 1F, a molding compound layer 250 is formed over the buffer layer 130 to cover the conductive layer 140, the conductive via structures 160, the chip structures C, and the adhesive layer 240, in accordance with some embodiments. The molding compound layer 250 includes a polymer material, in accordance with some embodiments. The molding compound layer 250 is formed using a molding process, in accordance with some embodiments.

Figure 1G:
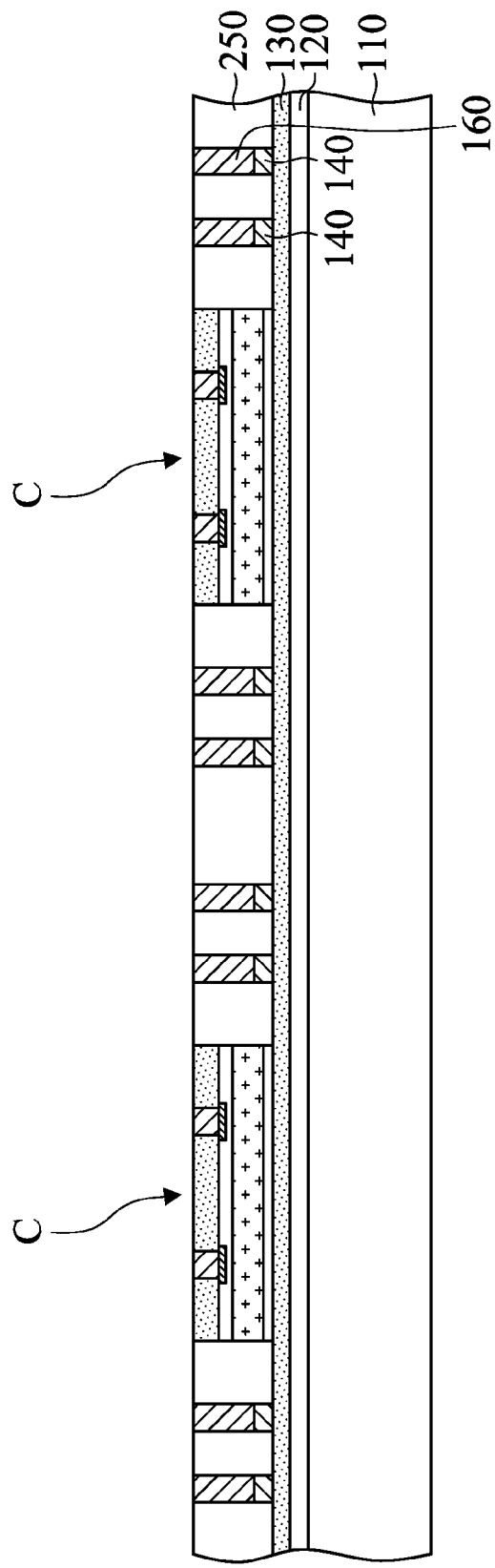

As shown in FIG. 1G, a top portion of the molding compound layer 250 is removed, in accordance with some embodiments. The removal process includes a chemical mechanical polishing process, in accordance with some embodiments. After the removal process, the molding compound layer 250 surrounds the chip structures C, the conductive layer 140, and the conductive via structures 160, in accordance with some embodiments.

Figure 1H:
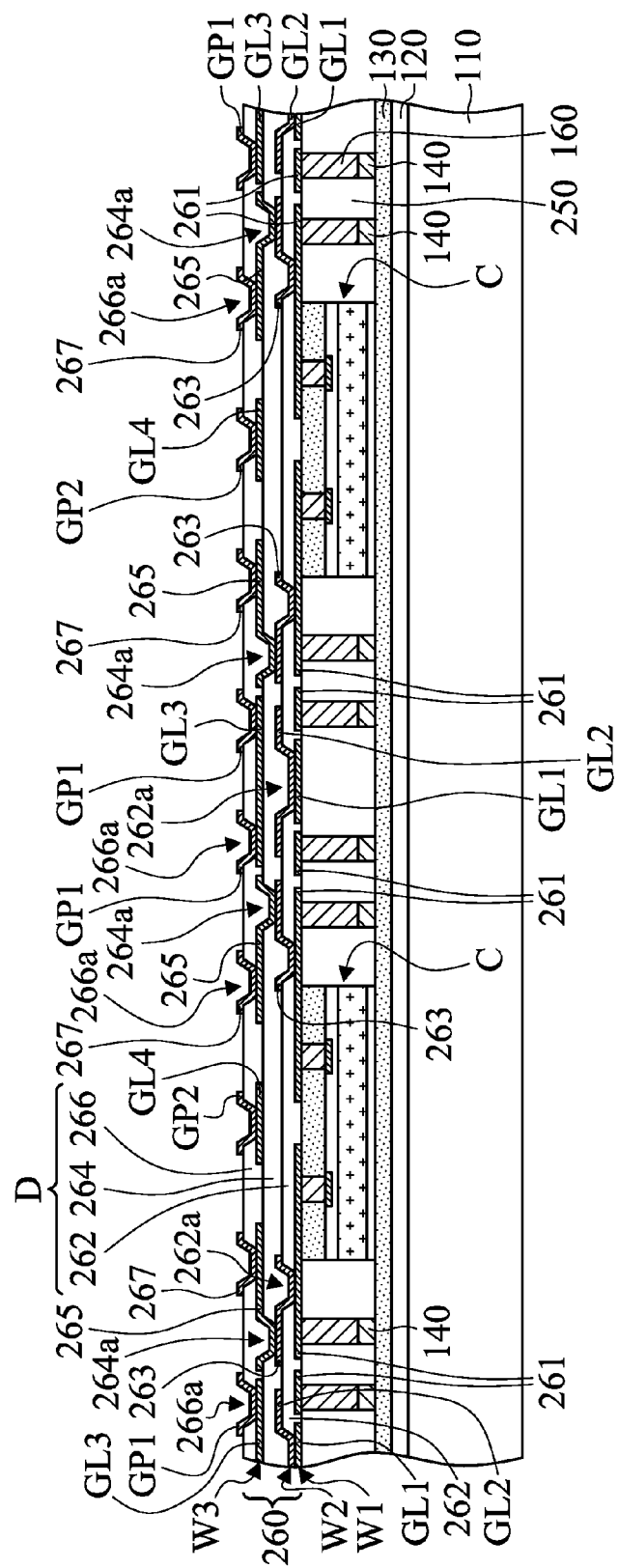

As shown in FIG. 1H, a wiring layer W1 is formed over the chip structures C, the molding compound layer 250, and the conductive via structures 160, in accordance with some embodiments. The wiring layer W1 includes redistribution lines 261 and grounding lines GL1, in accordance with some embodiments. The redistribution lines 261 are electrically connected to the conductive via structures 160 and the chip structures C, in accordance with some embodiments.

The grounding lines GL1 are electrically insulated from the redistribution lines 261, the conductive via structures 160, and the chip structures C, in accordance with some embodiments. Some of the grounding lines GL1 are formed right over (or right on) the molding compound layer 250 between the chip structures C, in accordance with some embodiments. The wiring layer W1 includes copper, aluminum, tungsten, titanium, combinations thereof, or another suitable conductive material.

As shown in FIG. 1H, a dielectric layer 262 is formed over the wiring layer W1, the molding compound layer 250, and the chip structures C, in accordance with some embodiments. The dielectric layer 262 has openings 262a exposing portions of the redistribution lines 261 and the grounding lines GL1, in accordance with some embodiments.

As shown in FIG. 1H, a wiring layer W2 is formed over the dielectric layer 262, in accordance with some embodiments. The wiring layer W2 includes redistribution lines 263 and grounding lines GL2, in accordance with some embodiments. The redistribution lines 263 extend into the openings 262a to electrically connect to the redistribution lines 261, in accordance with some embodiments.

The grounding lines GL2 extend into the openings 262a to electrically connect to the grounding lines GL1, in accordance with some embodiments. The grounding lines GL2 are electrically insulated from the redistribution lines 263, in accordance with some embodiments. The wiring layer W2 includes copper, aluminum, tungsten, titanium, combinations thereof, or another suitable conductive material.

As shown in FIG. 1H, a dielectric layer 264 is formed over the wiring layer W2 and the dielectric layer 262, in accordance with some embodiments. The dielectric layer 264 has openings 264a exposing portions of the redistribution lines 263, in accordance with some embodiments.

As shown in FIG. 1H, a wiring layer W3 is formed over the dielectric layer 264, in accordance with some embodiments. The wiring layer W3 includes redistribution lines 265 and grounding lines GL3 and GL4, in accordance with some embodiments. The redistribution lines 265 extend into the openings 264a to electrically connect to the redistribution lines 263, in accordance with some embodiments.

The grounding lines GL4 are electrically connected to the grounding lines GL1 and GL2, in accordance with some embodiments. The grounding lines GL3 and GL4 are electrically insulated from the redistribution lines 265, in accordance with some embodiments. The wiring layer W3 includes copper, aluminum, tungsten, titanium, combinations thereof, or another suitable conductive material.

As shown in FIG. 1H, a dielectric layer 266 is formed over the wiring layer W3 and the dielectric layer 264, in accordance with some embodiments. The dielectric layer 266 has openings 266a exposing portions of the redistribution lines 265 and the grounding lines GL3, in accordance with some embodiments.

As shown in FIG. 1H, pads 267 and grounding pads GP1 and GP2 are formed over the dielectric layer 266, in accordance with some embodiments. The pads 267 extend into the openings 266a to electrically connect to the redistribution lines 265 thereunder, in accordance with some embodiments. The grounding pads GP1 extend into the openings 266a to electrically connect to the grounding lines GL3, in accordance with some embodiments. The grounding pads GP2 extend into the openings 266a to electrically connect to the grounding lines GL4, in accordance with some embodiments.

The dielectric layers 262, 264, and 266 together form a dielectric structure D, in accordance with some embodiments. In some embodiments, the dielectric structure D and the molding compound layer 250 are made of different materials. The ground lines GL1, GL2, GL3, and GL4 are electrically insulated from the redistribution lines 261, 263, and 265 and the chip structures C by the dielectric structure D, in accordance with some embodiments. The dielectric structure D, the wiring layers W1, W2, and W3, the pads 267, and the grounding pads GP1 and GP2 together form a redistribution structure 260, in accordance with some embodiments.

Figure 1I:
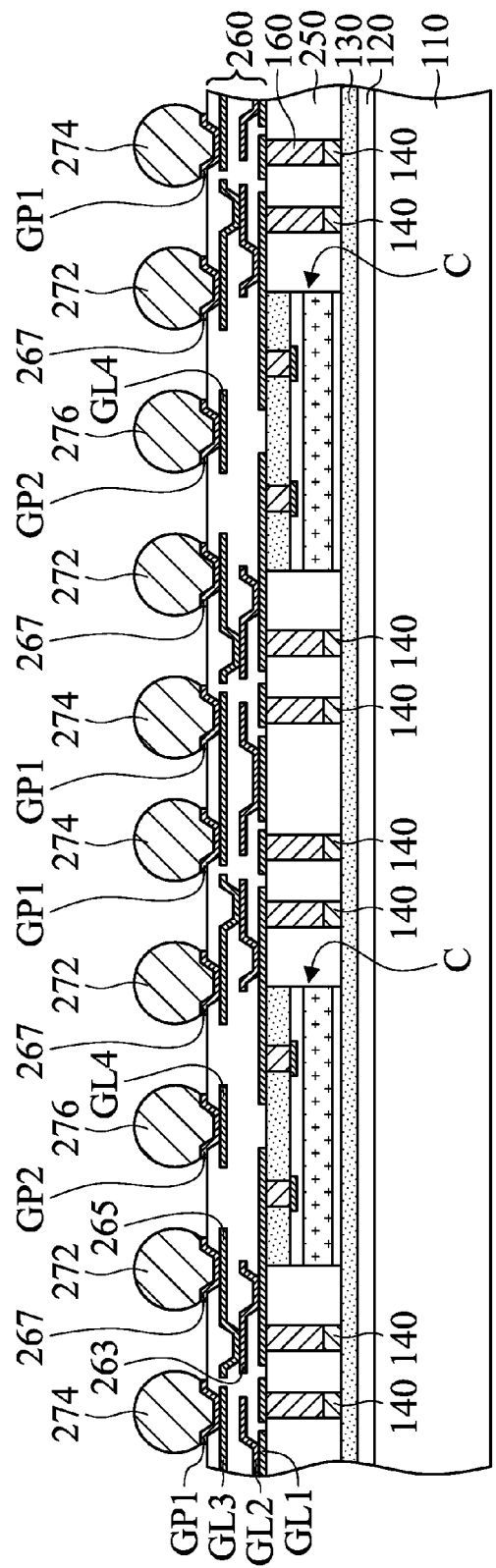

As shown in FIG. 1I, conductive bumps 272 and grounding bumps 274 and 276 are formed over the pads 267 and the grounding pads GP1 and GP2 respectively, in accordance with some embodiments. The conductive bumps 272 and the grounding bumps 274 and 276 include tin (Sn) or another suitable material, in accordance with some embodiments.

The formation of the conductive bumps 272 and the grounding bumps 274 and 276 includes forming a solder paste over the pads 267 and the grounding pads GP1 and GP2 and reflowing the solder paste, in accordance with some embodiments.

Figure 1J:
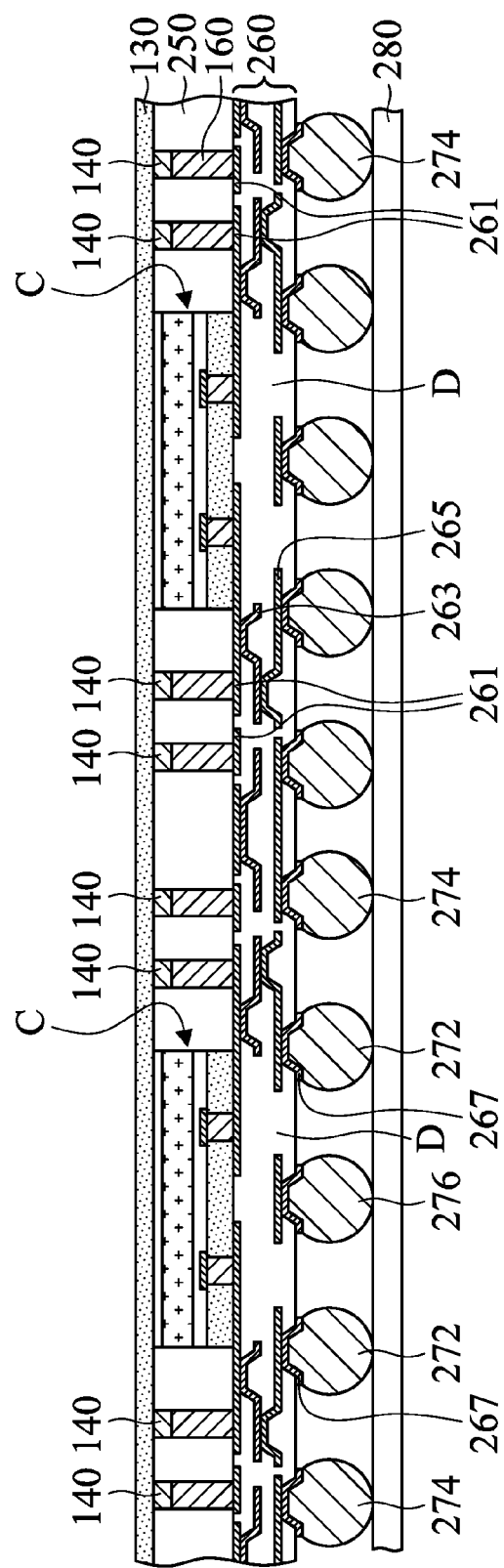

As shown in FIG. 1J, the chip structures C is flipped upside down and disposed over a frame 280 (or a carrier), in accordance with some embodiments. As shown in FIG. 1J, the carrier substrate 110 and the adhesive layer 120 are removed, in accordance with some embodiments.

Figure 1K:
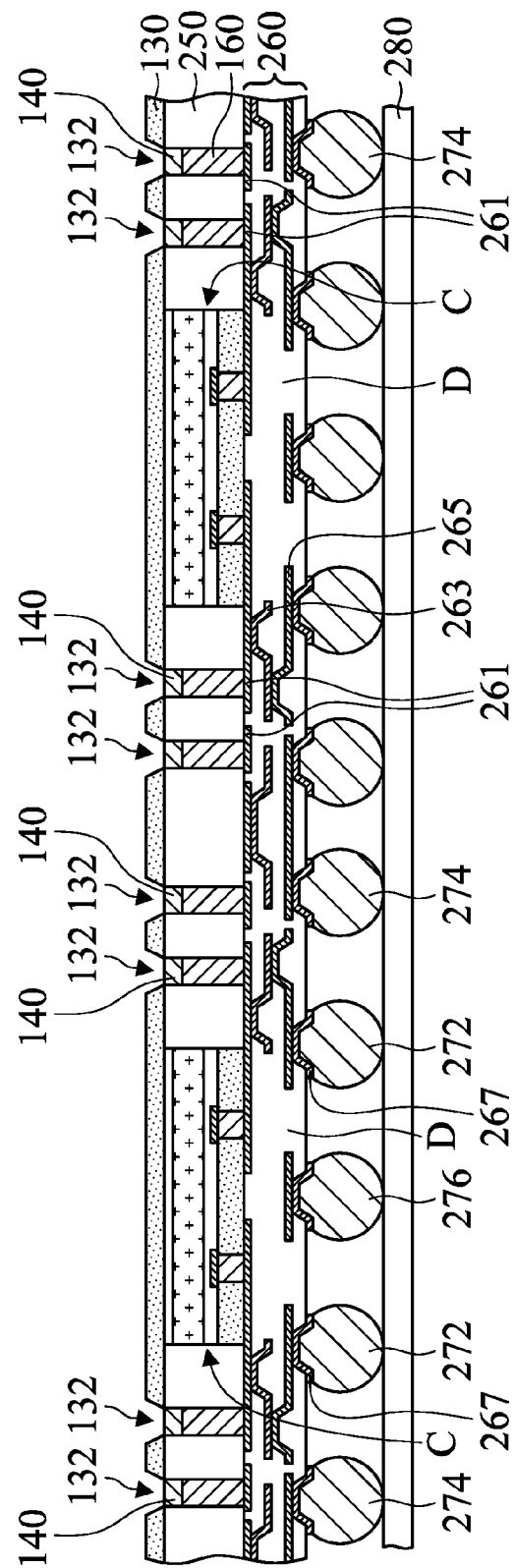

As shown in FIG. 1K, portions of the buffer layer 130 are removed to form openings 132 in the buffer layer 130, in accordance with some embodiments. The openings 132 expose the conductive layer 140, in accordance with some embodiments. The removal process may be a photolithography process, a laser debonding process, or an etching process, in accordance with some embodiments. In some other embodiments (not shown), the buffer layer 130 is completely removed to expose the conductive layer 140.

Figure 1L:
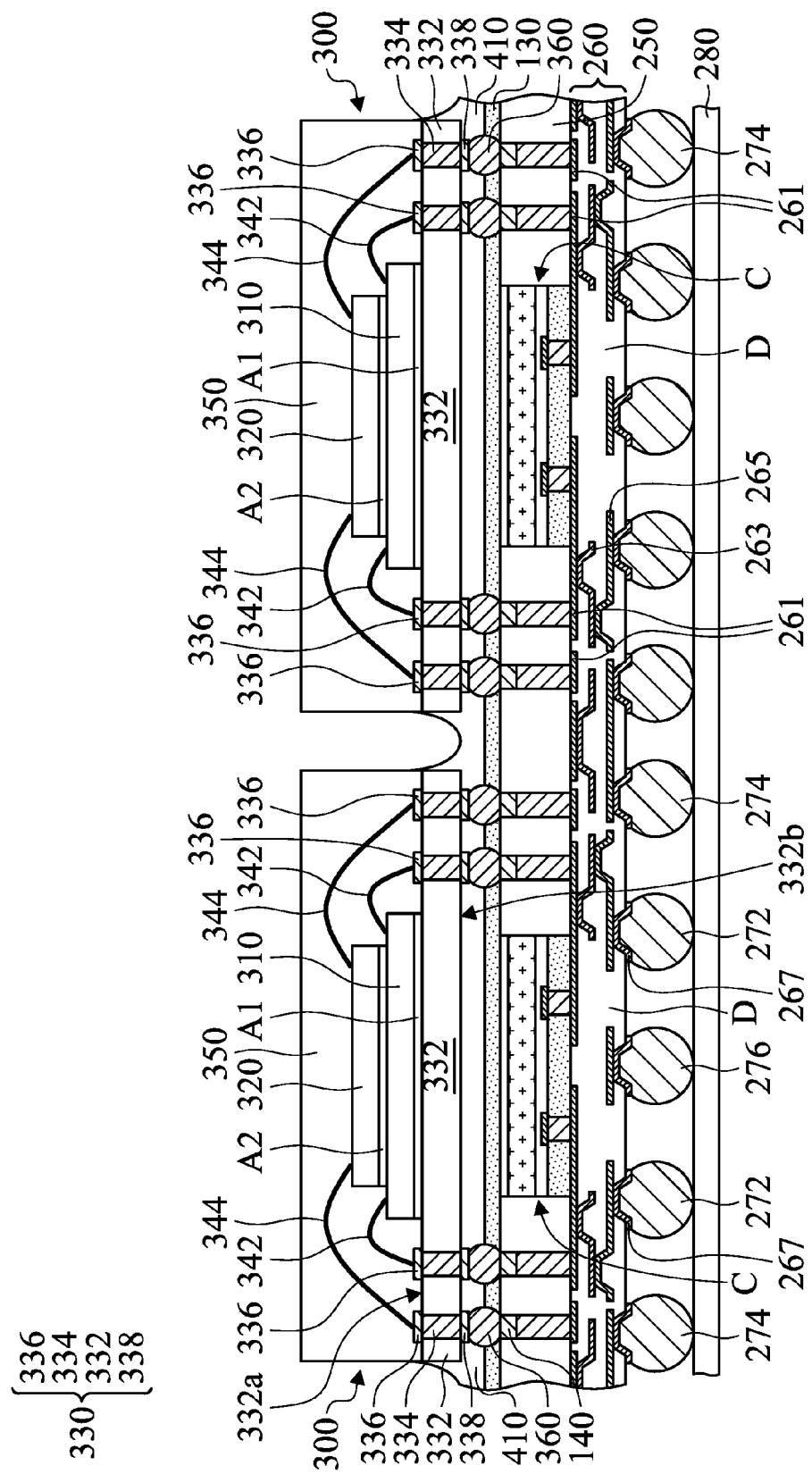

As shown in FIG. 1L, chip packages 300 are disposed over the chip structures C and the molding compound layer 250 to bond with the conductive layer 140, in accordance with some embodiments. Each of the chip packages 300 includes chips 310 and 320, a substrate 330, conductive wires 342 and 344, a molding compound layer 350, conductive bumps 360, in accordance with some embodiments.

The chips 310 and 320 are disposed over the substrate 330, in accordance with some embodiments. The chip 310 is bonded to the substrate 330 through an adhesive layer A1 therebetween, in accordance with some embodiments. The chip 320 is bonded to the chip 310 through an adhesive layer A2 therebetween, in accordance with some embodiments.

The substrate 330 includes a dielectric layer 332, conductive via structures 334, and bonding pads 336 and 338, in accordance with some embodiments. The dielectric layer 332 may have dielectric films (not shown) stacked with each other. The dielectric layer 332 has opposite surfaces 332a and 332b, in accordance with some embodiments. The conductive via structures 334 pass through the dielectric layer 332, in accordance with some embodiments.

The bonding pads 336 are positioned over the surface 332a, in accordance with some embodiments. The bonding pads 336 are positioned over the respective conductive via structures 334 to electrically connect to the respective conductive via structures 334, in accordance with some embodiments. The bonding pads 338 are positioned over the surface 332b, in accordance with some embodiments. The bonding pads 338 are positioned under the respective conductive via structures 334 to electrically connect to the respective conductive via structures 334, in accordance with some embodiments.

The conductive wires 342 physically and electrically connect the chip 310 to the bonding pads 336, in accordance with some embodiments. The conductive wires 344 physically and electrically connect the chip 320 to the bonding pads 336, in accordance with some embodiments. The molding compound layer 350 is molded over the chips 310 and 320, the conductive wires 342 and 344, and the substrate 330, in accordance with some embodiments.

The molding compound layer 350 is configured to protect the chips 310 and 320 and the conductive wires 342 and 344 from damage and contamination during subsequent processes, in accordance with some embodiments. The molding compound layer 350 includes a polymer material, in accordance with some embodiments.

The chip package 300 shown in FIG. 1L is an example. The chip package 300 is not limited to the type of the chip package 300 shown in FIG. 1L. That is, the chip packages 300 may be any suitable type of chip package. For example, the chip package 300 includes a chip surrounded by a molding compound layer, an underfill layer, a polymer layer, and/or the like. The chip package 300 includes a package-on-package (PoP) type semiconductor package, a multi-chip stacked package, a chip package including chips stacked on a substrate, a chip package including only one chip, or another suitable type of chip package.

The conductive bumps 360 connect the bonding pads 338 to the conductive layer 140, in accordance with some embodiments. As shown in FIG. 1L, an underfill layer 410 is filled between the substrate 330 and the buffer layer 130, in accordance with some embodiments. The underfill layer 410 includes a polymer material, in accordance with some embodiments.

Figure 1M:
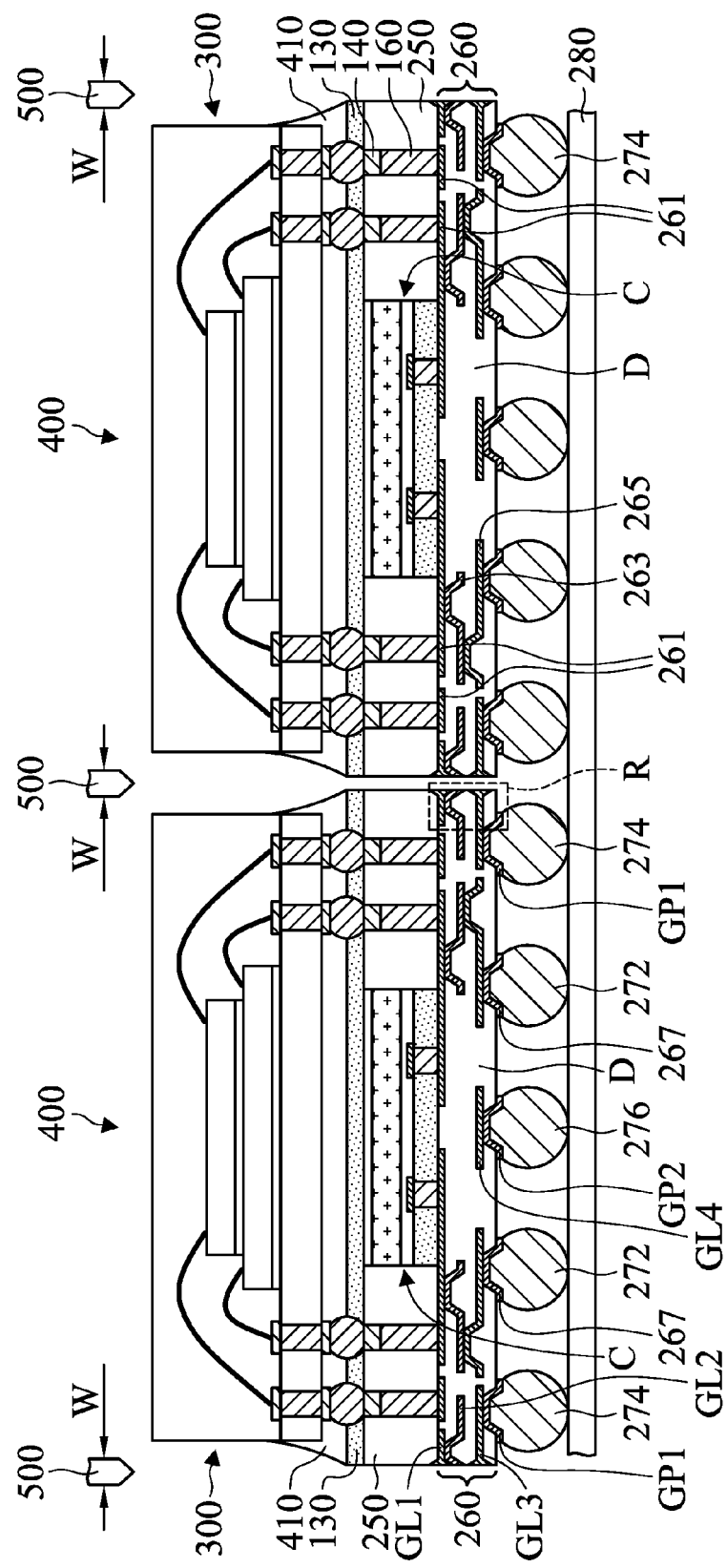
FIG. 1M-1 is an enlarged cross-sectional view of a region of FIG. 1M, in accordance with some embodiments.

As shown in FIG. 1M, a mechanical singulation process is performed over the underfill layer 410 and the buffer layer 130 between the chip packages 300, the molding compound layer 250 between the chip structures C, and the redistribution structure 260, in accordance with some embodiments. The mechanical singulation process cuts through the underfill layer 410, the buffer layer 130, the molding compound layer 250, the dielectric structure D, and the grounding lines GL1, GL2, and GL3 so as to form individual chip package structures 400, in accordance with some embodiments.

Each of the chip package structures 400 includes the chip packages 300, the chip structure C and portions of the molding compound layer 250, the dielectric structure D, the grounding lines GL1, GL2, GL3, and GL4, the redistribution lines 261, 263, and 265, the pads 267, the grounding pads GP1 and GP2, the conductive bumps 272, the grounding bumps 274 and 276, the conductive layer 140, and the conductive via structures 160, in accordance with some embodiments.

Figures 1, 1M, 2:
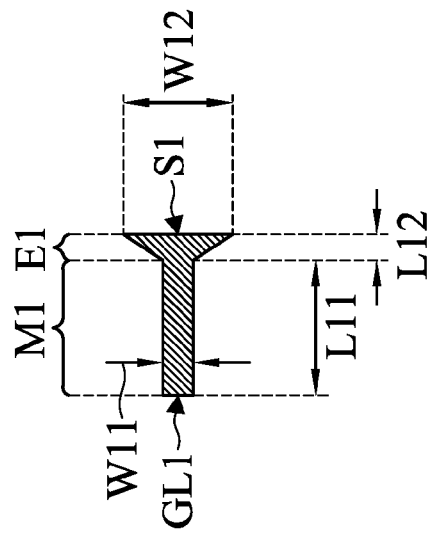
Figures 1, 1M:
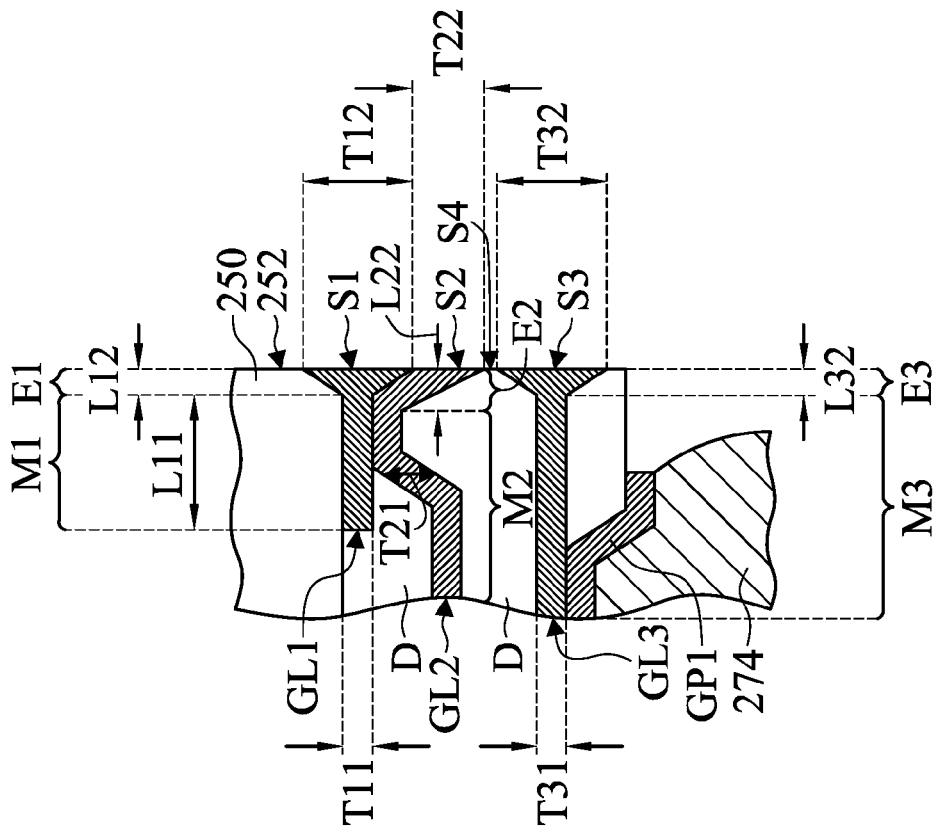

FIG. 1M-1 is an enlarged cross-sectional view of a region R of FIG. 1M, in accordance with some embodiments. As shown in FIG. 1M-1, the grounding lines GL1, GL2, and GL3 respectively define laterally accessible sidewalls S1, S2, and S3, in accordance with some embodiments. At least a portion of each of the sidewalls S1, S2, and S3 is not covered by the dielectric structure D, in accordance with some embodiments.

In some embodiments, the entire sidewalls S1, S2, and S3 are not covered by (e.g., full lateral exposure from) the dielectric structure D. The dielectric structure D defines a sidewall S4, in accordance with some embodiments. The molding compound layer 250 defines a sidewall 252, in accordance with some embodiments. The sidewalls S4 and 252 are also referred to as singulated sidewalls, in accordance with some embodiments. The sidewalls S1, S2, S3, S4, and 252 are substantially coplanar, in accordance with some embodiments.

Specifically, the grounding line GL1 includes a main portion M1 and an end enlarged portion E1 connected to the main portion M1, in accordance with some embodiments. A length L11 of the main portion M1 is greater than a length L12 of the end enlarged portion E1, in accordance with some embodiments.

A maximum thickness T12 of the end enlarged portion E1 is greater than a maximum thickness T11 of the main portion M1, in accordance with some embodiments. A ratio of the maximum thickness T12 to the maximum thickness T11 ranges from about 1.1 to 4, in accordance with some embodiments. In some embodiments, the main portion M1 has a substantially uniform thickness.

The grounding line GL2 includes a main portion M2 and an end enlarged portion E2 connected to the main portion M2, in accordance with some embodiments. A length (not shown) of the main portion M2 is greater than a length L22 of the end enlarged portion E2, in accordance with some embodiments.

A maximum thickness T22 of the end enlarged portion E2 is greater than a maximum thickness T21 of the main portion M2, in accordance with some embodiments. A ratio of the maximum thickness T22 to the maximum thickness T21 ranges from about 1.1 to 4, in accordance with some embodiments.

The grounding line GL3 includes a main portion M3 and an end enlarged portion E3 connected to the main portion M3, in accordance with some embodiments. A length (not shown) of the main portion M3 is greater than a length L32 of the end enlarged portion E3, in accordance with some embodiments. The end enlarged portions E1, E2, and E3 are exposed from the singulated sidewalls S4 and 252, in accordance with some embodiments.

A maximum thickness T32 of the end enlarged portion E3 is greater than a maximum thickness T31 of the main portion M3, in accordance with some embodiments. A ratio of the maximum thickness T32 to the maximum thickness T31 ranges from about 1.1 to 4, in accordance with some embodiments. In some embodiments, the main portion M3 has a substantially uniform thickness.

The ductility of the material of the grounding lines GL1, GL2, and GL3 is greater than that of the dielectric structure D, and therefore the maximum thicknesses T12, T22, and T32 of the end enlarged portions E1, E2, and E3 are enlarged by the mechanical singulation process, in accordance with some embodiments. As a result, the mechanical singulation process enlarges the area of the sidewalls S1, S2, and S3.

Therefore, the contact area between the grounding line GL1, GL2, or GL3 and a conductive shielding film, which is formed over the sidewalls S1, S2, and S3 subsequently, is enlarged as well. As a result, the contact resistance between the grounding lines GL1, GL2, and GL3 and the conductive shielding film is reduced, in accordance with some embodiments.

As shown in FIGS. 1M and 1M-1, the end enlarged portions E1 of the grounding lines GL1 partially extend into the molding compound layer 250, in accordance with some embodiments. FIG. 2 is an enlarged cross-sectional view partially showing a chip package structure, in accordance with some other embodiments. In some other embodiments, as shown in FIG. 2, when the hardness of the molding compound layer 250 is large enough, the end enlarged portions E1 of the grounding lines GL1 do not extend into the molding compound layer 250, in accordance with some embodiments.

FIG. 1M-2 is an enlarged top view of the grounding line GL1 of FIG. 1M, in accordance with some embodiments. As shown in FIG. 1M-2, a line width W12 of the end enlarged portion E1 is greater than a line width W11 of the main portion M1. That is, the line width W12 of the end enlarged portion E1 is enlarged by the mechanical singulation process, in accordance with some embodiments.

Similarly, the line widths of the end enlarged portion E2 and E3 are enlarged by the mechanical singulation process as well, in accordance with some embodiments. Therefore, a line width of the end enlarged portion E2 is greater than a line width of the main portion M2, and a line width of the end enlarged portion E3 is greater than a line width of the main portion M3, in accordance with some embodiments.

As shown in FIG. 1M-2, the line width W12 of the end enlarged portion E1 continuously increases from the main portion M1 to the sidewall S1, in accordance with some embodiments. Similarly, the line width of the end enlarged portion E2 continuously increases from the main portion M2 to the sidewall S2, in accordance with some embodiments. The line width of the end enlarged portion E3 continuously increases from the main portion M3 to the sidewall S3, in accordance with some embodiments.

As shown in FIG. 1M, the mechanical singulation process is performed using cutting wheels 500, in accordance with some embodiments. Each of the cutting wheels 500 has a width W ranging from about 50 μm to about 350 μm, in accordance with some embodiments. In some embodiments, the width W of each of the cutting wheels 500 depends on a width of a saw street between two adjacent chip package structures 400. In some embodiments, a saw blade speed of the mechanical singulation process ranges from about 5000 rpm to about 45000 rpm.

When the width W and the saw blade speed are large enough (such as greater than 50 μm and 5000 rpm), the mechanical singulation process is able to effectively enlarge the area of the sidewalls S1, S2, and S3. Therefore, the contact resistance between the grounding lines GL1, GL2, and GL3 and the conductive shielding film is effectively reduced, in accordance with some embodiments.

Figure 1N:
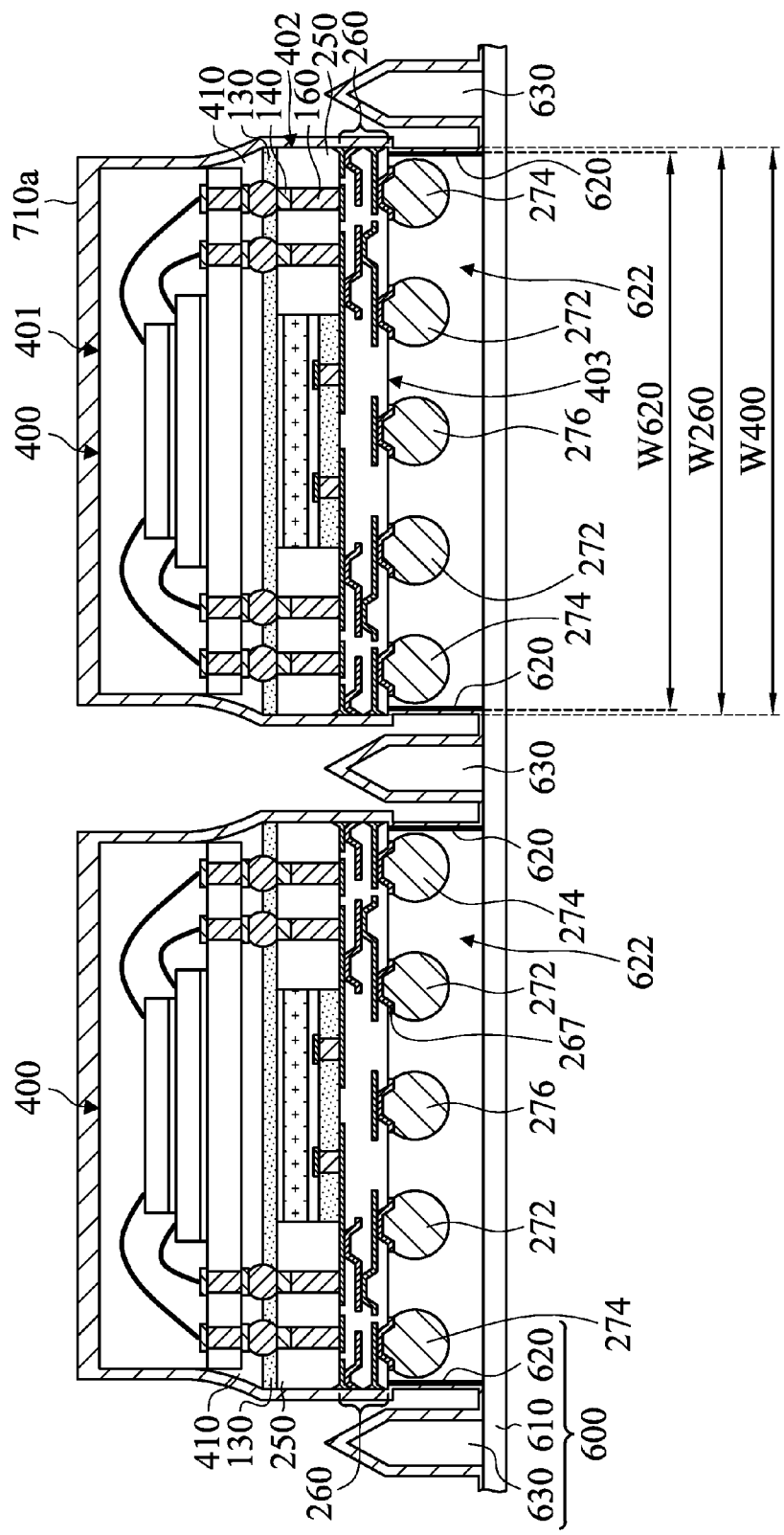
Figures 1, 1N:
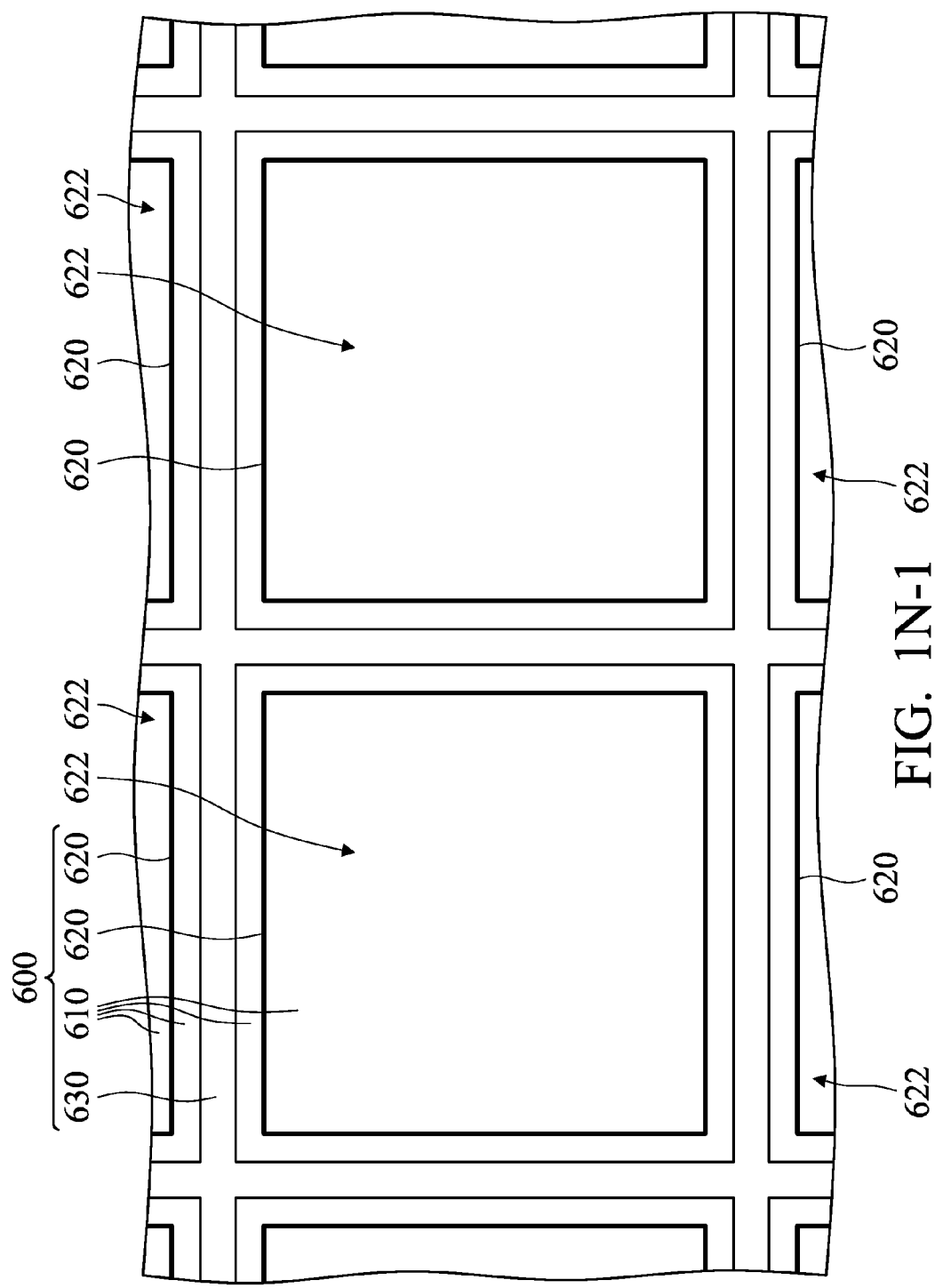
Figure 10:
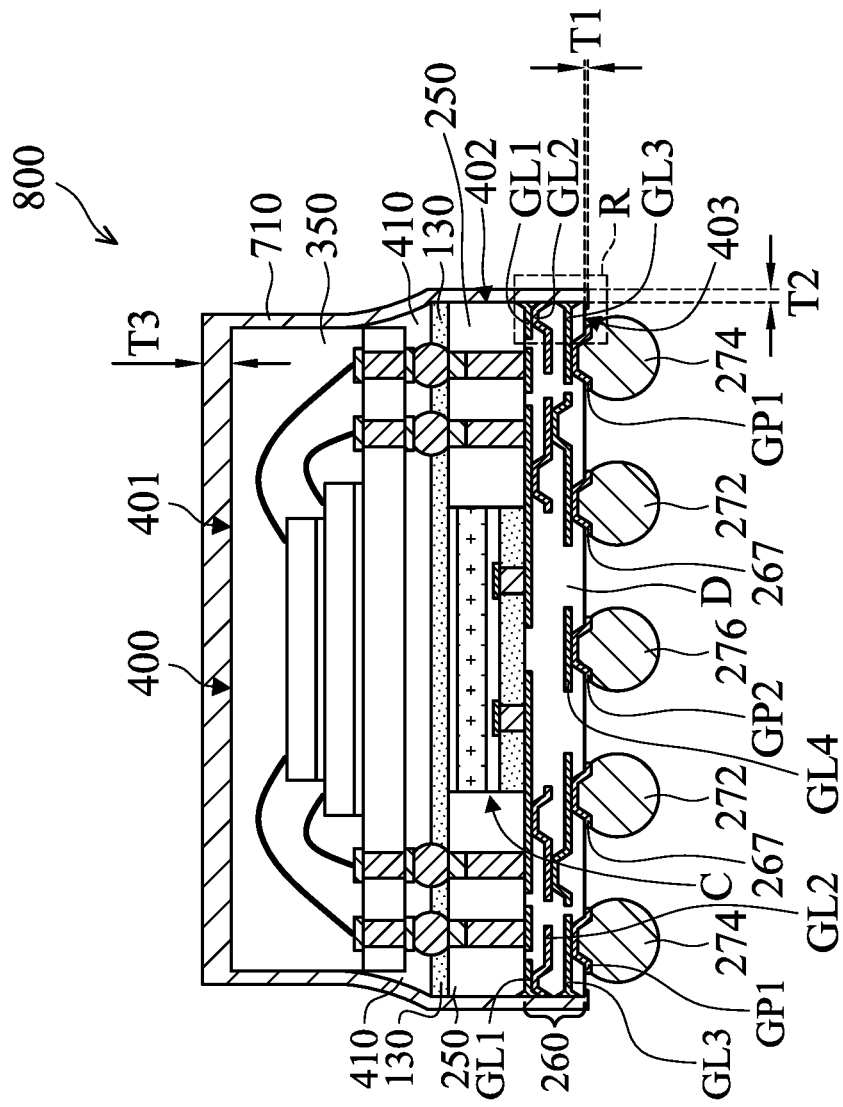
Figure 2:
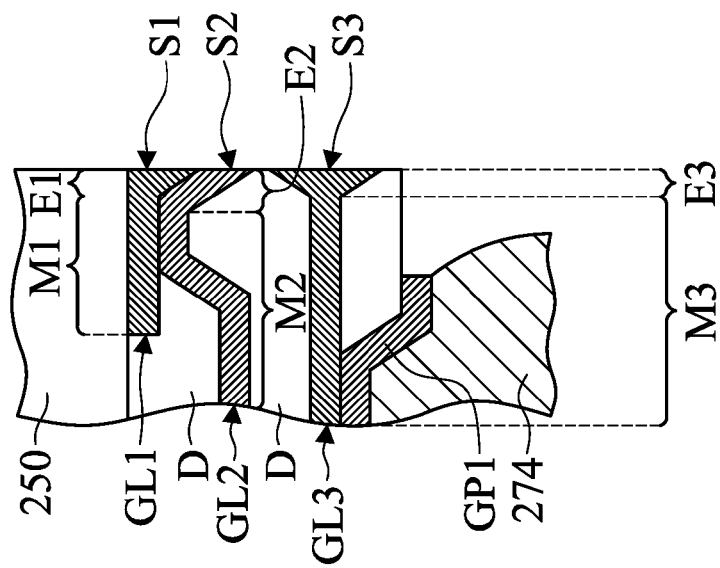
Figures 1, 10:
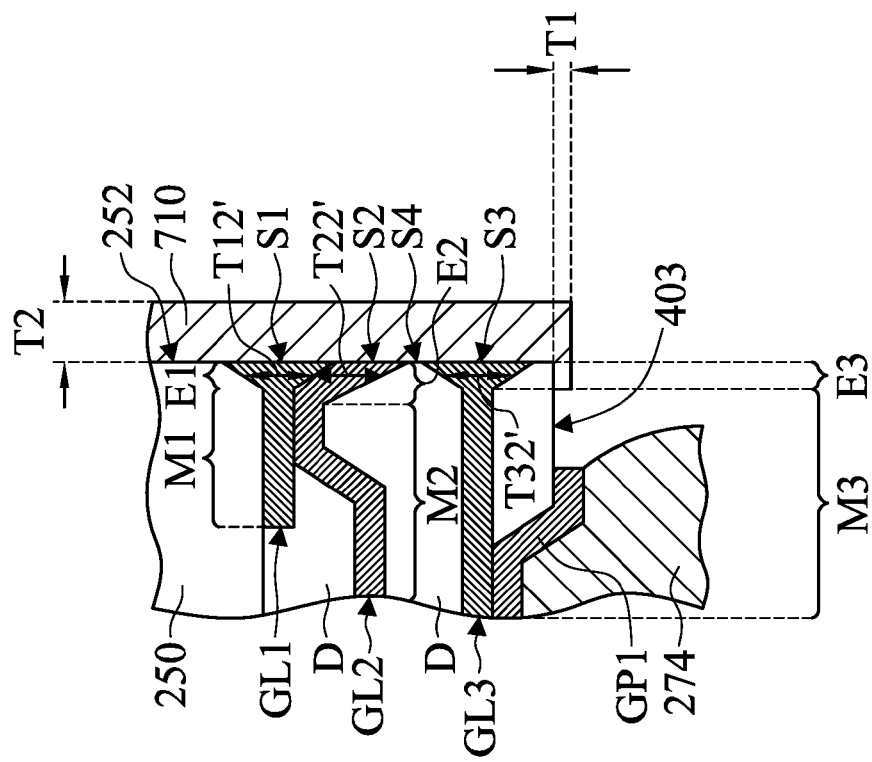

FIG. 1N-1 is a top view of a tray in FIG. 1N, in accordance with some embodiments. As shown in FIGS. 1N and 1N-1, the chip package structures 400 are disposed over a tray 600, in accordance with some embodiments. The tray 600 includes a substrate 610, support frame structures 620, and a spacer structure 630, in accordance with some embodiments.

The support frame structures 620 are disposed over the substrate 610 and spaced from each other, in accordance with some embodiments. The support frame structures 620 are arranged in an array, in accordance with some embodiments. Each of the support frame structures 620 has an opening 622 exposing the substrate 610, in accordance with some embodiments. In some embodiments, the width W620 of the support frame structure 620 is less than a width W400 of the chip package structure 400. In some embodiments, a width W620 of the support frame structure 620 is less than a width W260 of the redistribution structure 260.

The support frame structure 620 has a top view shape corresponding to the top view shape of the chip package structure 400 (or the redistribution structure 260) over the support frame structure 620, in accordance with some embodiments. For example, the chip package structure 400 has a square shape, and the support frame structure 620 also has a square shape. The support frame structure 620 has a rectangular shape, a diamond shape, or another suitable shape.

The spacer structure 630 is disposed over the substrate 610 and between the support frame structures 620, in accordance with some embodiments. The spacer structure 630 is spaced from the support frame structures 620, in accordance with some embodiments. The substrate 610, the support frame structures 620, and the spacer structure 630 are made of the same material, such as metal, ceramic, alloy (e.g., stainless steel or Al alloy), or polymer, in accordance with some embodiments.

The chip package structures 400 are disposed over the respective support frame structures 620, in accordance with some embodiments. The conductive bumps 272 and the grounding bumps 274 and 276 of the chip package structure 400 are in the opening 622 of the support frame structure 620 under the chip package structure 400, in accordance with some embodiments.

As shown in FIG. 1N, a conductive shielding material layer 710a is formed over the chip package structures 400 and the tray 600, in accordance with some embodiments. The conductive shielding material layer 710a conformally covers the chip package structures 400 and the tray 600, in accordance with some embodiments. The conductive shielding material layer 710a conformally covers a top surface 401, sidewalls 402, and a peripheral portion of a bottom surface 403 of each of the package structures 400, in accordance with some embodiments.

The conductive shielding material layer 710a includes a metal material, such as copper, titanium, stainless steel, Fe—Ni alloy, iron, aluminum, nickel, silver, gold, chromium, or Ti—W alloy. The formation of the conductive shielding material layer 710a includes a deposition process, such as a physical vapor deposition process, a chemical vapor deposition process (e.g. an atmospheric pressure plasma chemical vapor deposition process), or a spray (jetting) process, in accordance with some embodiments. In some embodiments, the formation of the conductive shielding material layer 710a includes a plating process, such as an electroless plating process.

As shown in FIG. 1O, the tray 600 is removed, in accordance with some embodiments. In this step, chip package structures 800 are substantially formed, in accordance with some embodiments. For the sake of simplicity, FIG. 1O only shows one of the chip package structures 800. After the removal of the tray 600, the conductive shielding material layer 710a remaining over the chip package structure 400 forms a conductive shielding film 710, in accordance with some embodiments. The conductive shielding film 710 is configured as an electromagnetic interference (EMI) shield film, in accordance with some embodiments.

The conductive shielding film 710 is electrically connected to the grounding lines GL1, GL2, GL3, and GL4, in accordance with some embodiments. The conductive shielding film 710 is electrically connected to the grounding bumps 274 through the grounding lines GL3 and the grounding pads GP1, in accordance with some embodiments. The conductive shielding film 710 is electrically connected to the grounding bump 276 through the grounding lines GL1, GL2, and GL4 and the grounding pad GP2, in accordance with some embodiments.

The conductive shielding film 710 is in direct contact with the grounding lines GL1, GL2, and GL3, the dielectric structure D, the molding compound layer 250, the buffer layer 130, the underfill layer 410, and the molding compound layer 350, in accordance with some embodiments. The conductive shielding film 710 conformally covers the grounding lines GL1, GL2, and GL3, the dielectric structure D, the molding compound layer 250, the buffer layer 130, the underfill layer 410, and the molding compound layer 350, in accordance with some embodiments.

FIG. 1O-1 is an enlarged cross-sectional view of a region R of FIG. 1O, in accordance with some embodiments. As shown in FIGS. 1O and 1O-1, the conductive shielding film 710 conformally covers and is in direct contact with the sidewalls S1, S2, S3, S4, and 252 of the grounding lines GL1, GL2, and GL3, the dielectric structure D, the molding compound layer 250, in accordance with some embodiments.

As shown in FIGS. 1N, 1O, and 1O-1, during the formation of the conductive shielding material layer 710a, since the shielding of the redistribution structure 260, the conductive shielding film 710 (or the conductive shielding material layer 710a) over the bottom surface 403 has a thickness T1 less than a thickness T2 of the conductive shielding film 710 over the sidewalls 402, in accordance with some embodiments. The thickness T2 ranges from about 0.05 μm to about 50 μm, in accordance with some embodiments.

Since the thickness T1 is small, the separation of the conductive shielding material layer 710a over the bottom surface 403 and the conductive shielding material layer 710a over the support frame structure 620 is easy and does not damage the conductive shielding material layer 710a remaining over the bottom surface 403, in accordance with some embodiments.

As shown in FIGS. 1N, 1O, and 1O-1, when the conductive shielding material layer 710a is formed using a deposition process, the thickness T2 of the conductive shielding film 710 over the sidewalls 402 is less than a thickness T3 of the conductive shielding film 710 over the top surface 401, in accordance with some embodiments. That is, the thickness T3 is greater than the thickness T2, and the thickness T2 is greater than the thickness T1, in accordance with some embodiments.

As shown in FIG. 1O-1, a thickness T12' of the end enlarged portion E1 continuously increases from the main portion M1 to the conductive shielding film 710, in accordance with some embodiments. In some embodiments, a thickness T22' of the end enlarged portion E2 continuously increases from the main portion M2 to the conductive shielding film 710. In some embodiments, a thickness T32' of the end enlarged portion E3 continuously increases from the main portion M3 to the conductive shielding film 710.

Since the thicknesses T12', T22', and T32' of the end enlarged portions E1, E2, and E3 are enlarged by the mechanical singulation process, the area of the sidewalls S1, S2, and S3 is enlarged as well. Therefore, the contact resistance between the grounding lines GL1, GL2, and GL3 and the conductive shielding film 710 is reduced, in accordance with some embodiments. As shown in FIGS. 1M-1 and 1O-1, the end enlarged portion E1 or E3 includes a cross-sectional profile of a fan shape (or a trapezoid shape), in accordance with some embodiments.

In accordance with some embodiments, chip package structures and methods for forming the same are provided.

The methods (for forming the chip package structure) form a redistribution structure including a dielectric structure and a grounding line therein, and the grounding line includes a main portion and an end enlarged portion connected to the main portion. The end enlarged portion is thicker than the main portion. A sidewall of the end enlarged portion is not covered by the dielectric structure. The methods form a chip structure over the redistribution structure and form a conductive shielding film over the chip structure and the first sidewall to electrically connect to the grounding line. Therefore, the conductive shielding film is able to be grounded through the grounding line. Since the end enlarged portion is thicker than the main portion, the contact area between the grounding line and the conductive shielding film is enlarged. Therefore, the contact resistance between the grounding line and the conductive shielding film is reduced.

In accordance with some embodiments, a chip package structure is provided. The chip package structure includes a redistribution structure including a dielectric structure and a grounding line in the dielectric structure. The grounding line includes a main portion and an end enlarged portion connected to the main portion and laterally accessible from the dielectric structure. The chip package structure includes a chip structure over the redistribution structure. The chip package structure includes a conductive shielding film disposed over the chip structure and a first sidewall of the end enlarged portion. The conductive shielding film is electrically connected to the grounding line. A thickness of the end enlarged portion increases from the main portion to the conductive shielding film.

In accordance with some embodiments, a chip package structure is provided. The chip package structure includes a redistribution structure including a dielectric structure and a grounding line in the dielectric structure. The grounding line includes a main portion and an end enlarged portion connected to the main portion and laterally accessible from the dielectric structure. A maximum thickness of the end enlarged portion is greater than a maximum thickness of the main portion. The end enlarged portion defines a first sidewall, and at least a portion of the first sidewall is not covered by the dielectric structure. The chip package structure includes a chip structure over the redistribution structure. The chip package structure includes a conductive shielding film disposed over the chip structure and electrically connected to the grounding line through the end enlarged portion.

In accordance with some embodiments, a method for forming a chip package structure is provided. The method includes providing a first chip structure, a second chip structure, and a molding compound layer surrounding the first chip structure and the second chip structure. The method includes forming a redistribution structure over the first chip structure, the second chip structure, and the molding compound layer. The redistribution structure includes a dielectric structure and a grounding line in the dielectric structure. The method includes performing a mechanical singulation process between the first chip structure and the second chip structure to cut through the molding compound layer, the dielectric structure, and the grounding line so as to form a first chip package structure and a second chip package structure and to generate end enlarged portions in the grounding line respectively exposed from singulated sidewalls of the first and the second chip package structures. The method includes forming a first conductive shielding film and a second conductive shielding film over the first chip package structure and the second chip package structure respectively. The first and the second conductive shielding films are electrically connected to the end enlarged portions exposed from the respective singulated sidewalls of the first and the second chip package structures, respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
   a redistribution structure comprising a dielectric structure and a grounding line in the dielectric structure, wherein the grounding line comprises a main portion and an end enlarged portion connected to the main portion and laterally accessible from the dielectric structure;
   a chip structure over the redistribution structure; and
   a conductive shielding film disposed over the chip structure and a first sidewall of the end enlarged portion,
   wherein the conductive shielding film is electrically connected to the grounding line,
   wherein the redistribution structure has a top surface and a bottom surface opposite to the top surface, the chip structure is over the top surface, and the conductive shielding film covers a portion of the bottom surface, and
   wherein a thickness of the end enlarged portion increases from the main portion to the conductive shielding film.

2. The chip package structure as claimed in claim 1, wherein the conductive shielding film is in direct contact with the first sidewall of the end enlarged portion.

3. The chip package structure as claimed in claim 1, wherein the dielectric structure has a second sidewall, and the chip package structure further comprises:
   a molding compound layer over the redistribution structure and surrounding the chip structure, wherein the molding compound layer has a third sidewall, and the first sidewall, the second sidewall, and the third sidewall are substantially coplanar.

4. The chip package structure as claimed in claim 3, wherein the conductive shielding film conformally covers the first sidewall, the second sidewall, and the third sidewall.

5. The chip package structure as claimed in claim 1, wherein the conductive shielding film covers a top surface of the chip structure, and a first thickness of the conductive shielding film covering the top surface of the chip structure is greater than a second thickness of the conductive shielding film covering the first sidewall.

6. The chip package structure as claimed in claim 1, wherein the second thickness of the conductive shielding film covering the first sidewall is greater than a third thickness of the conductive shielding film covering the bottom surface of the redistribution structure.

7. The chip package structure as claimed in claim 1, wherein the thickness of the end enlarged portion continuously increases from the main portion to the conductive shielding film.

8. The chip package structure as claimed in claim 1, wherein the chip structure is over the top surface of the redistribution structure, and the chip package structure further comprises:
a conductive bump over the bottom surface of the redistribution structure, wherein the conductive shielding film and the grounding line are electrically connected to the conductive bump.

9. A chip package structure, comprising:
a redistribution structure comprising a dielectric structure and a grounding line in the dielectric structure,
wherein the grounding line comprises a main portion and an end enlarged portion connected to the main portion and laterally accessible from the dielectric structure,
wherein a maximum thickness of the end enlarged portion is greater than a maximum thickness of the main portion,
wherein the end enlarged portion defines a first sidewall, and
wherein at least a portion of the first sidewall is not covered by the dielectric structure;
a chip structure over the redistribution structure;
a conductive shielding film disposed over the chip structure and electrically connected to the grounding line through the end enlarged portion; and
a chip package between the conductive shielding film and the chip structure,
wherein the redistribution structure comprises a second grounding line in the dielectric structure, the second grounding line comprises a second main portion and a second end enlarged portion connected to the second main portion, and the end enlarged portion of the grounding line is in direct contact with the second end enlarged portion of the second grounding line.

10. The chip package structure as claimed in claim 9, wherein the conductive shielding film is in direct contact with the first sidewall of the end enlarged portion.

11. The chip package structure as claimed in claim 9, wherein the grounding line is electrically insulated from the chip structure by the dielectric structure.

12. The chip package structure as claimed in claim 9, wherein the end enlarged portion comprises a cross-sectional profile of a fan shape or a trapezoid shape.

13. The chip package structure as claimed in claim 9, wherein a line width of the end enlarged portion is greater than a line width of the main portion.

14. The chip package structure as claimed in claim 9, wherein the dielectric structure has a second sidewall, and the chip package structure further comprises:
a molding compound layer over the redistribution structure and surrounding the chip structure, wherein the molding compound layer has a third sidewall, the first sidewall, the second sidewall, and the third sidewall are substantially coplanar, and the end enlarged portion partially extends into the molding compound layer.

15. A chip package structure, comprising:
a redistribution structure comprising a dielectric structure, a first grounding line, and a second grounding line in the dielectric structure,
wherein the first grounding line comprises a first main portion and a first end enlarged portion connected to the first main portion and laterally accessible from the dielectric structure,
wherein the second grounding line comprises a second main portion and a second end enlarged portion connected to the second main portion and laterally accessible from the dielectric structure, and
wherein the first end enlarged portion is in direct contact with the second end enlarged portion;
a chip structure over the redistribution structure; and
a conductive shielding film disposed over the chip structure, a first sidewall of the first end enlarged portion, and a second sidewall of the second end enlarged portion,
wherein the conductive shielding film is electrically connected to the first grounding line and the second grounding line,
wherein a thickness of the first end enlarged portion increases from the first main portion to the conductive shielding film, and
wherein a thickness of the second end enlarged portion increases from the second main portion to the conductive shielding film.

16. The chip package structure as claimed in claim 15, wherein the first main portion is in direct contact with the second main portion.

17. The chip package structure as claimed in claim 15, wherein the first sidewall of the first end enlarged portion, the second sidewall of the second end enlarged portion, and a third sidewall of the dielectric structure are substantially coplanar.

18. The chip package structure as claimed in claim 17, further comprising:
a molding compound layer over the redistribution structure and surrounding the chip structure,
wherein the molding compound layer has a fourth sidewall,
wherein the first sidewall, the second sidewall, the third sidewall, and the fourth sidewall are substantially coplanar, and
wherein the first end enlarged portion partially extends into the molding compound layer.

19. The chip package structure as claimed in claim 18, wherein the redistribution structure has a top surface and a bottom surface opposite to the top surface,
wherein the chip structure is over the top surface,
wherein the conductive shielding film is further disposed over the bottom surface,
wherein the conductive shielding film over the chip structure is thicker than the conductive shielding film over the first sidewall, the second sidewall, the third sidewall, and the fourth sidewall, and
wherein the conductive shielding film over the first sidewall, the second sidewall, the third sidewall, and the fourth sidewall is thicker than the conductive shielding film over the bottom surface.

20. The chip package structure as claimed in claim 10, wherein the second end enlarged portion defines a fourth sidewall, the fourth sidewall is in direct contact with the conductive shielding film and is substantially coplanar with the first sidewall of the end enlarged portion.

\* \* \* \* \*